United States Patent [19]
Tonti et al.

[11] Patent Number: 5,729,052
[45] Date of Patent: Mar. 17, 1998

[54] INTEGRATED ULSI HEATSINK

[75] Inventors: William R. Tonti, Essex Junction, Vt.; Jack A. Mandelman, Stormville, N.Y.; Jerzy M. Zalesinski; Toshiharu Furukawa, both of Essex Junction, Vt.; Son V. Nguyen, Hopewell Junction, N.Y.; Dureseti Chidambarrao, Sandy Hook, Conn.

[73] Assignee: International Business Machines Corporation, Armonk, N.Y.

[21] Appl. No.: 667,210

[22] Filed: Jun. 20, 1996

[51] Int. Cl.$^6$ .................................. H01L 23/34
[52] U.S. Cl. ............................ 257/712; 257/713
[58] Field of Search .......................... 257/712, 713, 257/719, 722

[56] References Cited

U.S. PATENT DOCUMENTS

| | | | |
|---|---|---|---|
| 4,532,539 | 7/1985 | Frister | 357/81 |
| 4,607,277 | 8/1986 | Hassan et al. | 357/81 |
| 4,866,505 | 9/1989 | Roberts et al. | 357/71 |
| 4,879,632 | 11/1989 | Yamamoto et al. | 361/386 |
| 5,070,936 | 12/1991 | Carroll et al. | 165/80.4 |
| 5,297,006 | 3/1994 | Mizukoshi | 361/704 |
| 5,396,403 | 3/1995 | Patel | 361/705 |
| 5,450,283 | 9/1995 | Lin et al. | 361/704 |

FOREIGN PATENT DOCUMENTS

| | | |
|---|---|---|
| 57-13635-2 | 8/1982 | Japan. |
| 265263 | 3/1990 | Japan. |
| 4-180253 | 6/1992 | Japan. |
| 4041849-51 | 7/1992 | Japan. |
| 43654155 | 12/1992 | Japan. |
| 6-125022 | 5/1994 | Japan. |
| 6163764 | 6/1994 | Japan. |

*Primary Examiner*—Tom Thomas
*Assistant Examiner*—Roy Potter
*Attorney, Agent, or Firm*—Whitham, Curtis, Whitham & McGinn; Mark Chadurjian

[57] ABSTRACT

A simple and low cost ULSI integrated heatsink more efficiently removes heat from a silicon package by integrating the heat sink material into the silicon die, transforming the present two-dimensional art into three dimensions. The fabrication of a high power integrated ULSI package and heatsink begins by fabricating an integrated circuit wafer up to the point of dicing the wafer into individual chips. The front side of the wafer is protected, while the backside of the wafer is exposed. The exposed backside is roughened by chemical and/or mechanical process. Optionally, a gettering process is then performed to remove impurities. The roughened backside is then coated with metal interlayers, preferably aluminum (Al) followed by chromium (Cr). A layer of copper (Cu) is optionally coated on the metal interlayers. A highly conductive reflowable material, such as solder or gold eutectic, is deposited on the metal interlayers. At this point, the wafer is diced to form chips. The heatsink itself is prepared by first optionally roughening the surface and metalizing the backside of the heatsink with metal interlayer. Next, the chip is thermally attached to the heatsink by reflowing the thermally conductive reflowable material.

6 Claims, 7 Drawing Sheets

SURFACE NOT PROCESSED

SURFACE AREA ENLARGED (1.5+2)X BY BOMBARDING WITH PARTICLES

SURFACE AREA ENLARGED (1.5-2)X BY ETCHING TRENCHES

INTEGRATED ULSI HEATSINK

BACKGROUND OF THE INVENTION

1. Field of the Invention

The present invention generally relates to packaging of integrated circuits (ICs) and, more particularly, to an improved heat sink for high density ICs and method of making the same.

2. Background Description

As photolithography capability improves and silicon technology migrates from very large scale integrated (VLSI circuits to ultra large scale integrated (ULSI circuits, power dissipation becomes a limiting function of ULSI densities and allowed die size. Current art provides heatsinks comprised of multiple material layers with varying thermal conductivities. The approach is to attach a heatsink by means of a thermal adhesive to the IC package. The IC package itself is relied on to provide a thermal path from the chip to the heatsink via the thermal adhesive. In some cases, the heatsink has been augmented by the addition of a cooling fan attached to the heatsink, but this adds expense and draws power. What is needed, therefore, is a heatsink design that improves both the intrinsic and extrinsic efficiency of the prior art heat sinks.

SUMMARY OF THE INVENTION

It is therefore an object of the present invention to provide a simple and low cost ULSI integrated heatsink technique which improves upon the present art by utilizing simple processing capabilities already practiced by silicon fabricators.

It is another object of the invention to use conventional chip metallurgy to thermally join dissimilar surfaces with extremely low thermal resistance.

According to the invention, heat is more efficiently removed from a silicon package by integrating the heat sink material into the silicon die. The fabrication of a high power integrated ULSI package and heatsink according to the invention begins by fabricating an integrated circuit wafer up to the point of dicing the wafer into individual chips. The front side of the wafer is protected, while the backside of the wafer is exposed. The exposed backside is roughened by a sandblast process or by patterned trenches. Optionally, a gettering process is then performed to remove impurities. The roughened backside is then coated with metal interlayers, preferably aluminum (Al) followed by chromium (Cr). A layer of copper (Cu) is optionally coated on the metal interlayers. A thermally conductive reflowable material, such as solder or gold eutectic, is deposited on the metal interlayers. At this point, the wafer is diced to form chips. The heatsink itself is prepared by first optionally roughening the surface and metalizing the backside of the heatsink with metal interlayer. Next, the chip is thermally attached to the heatsink by reflowing the thermally conductive reflowable material. Finally, a flex card or substrate is placed over the chip.

The resulting heatsink according to the invention realizes substantial improvements in both intrinsic and extrinsic properties. Intrinsic properties are improved on the order of 202 times, and extrinsic properties are improved on the order of 160 times. Moreover, the integrated package fabricated with the roughened wafer surface will resist delamination typically two and one half times more than a package which does not use a roughened wafer surface.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
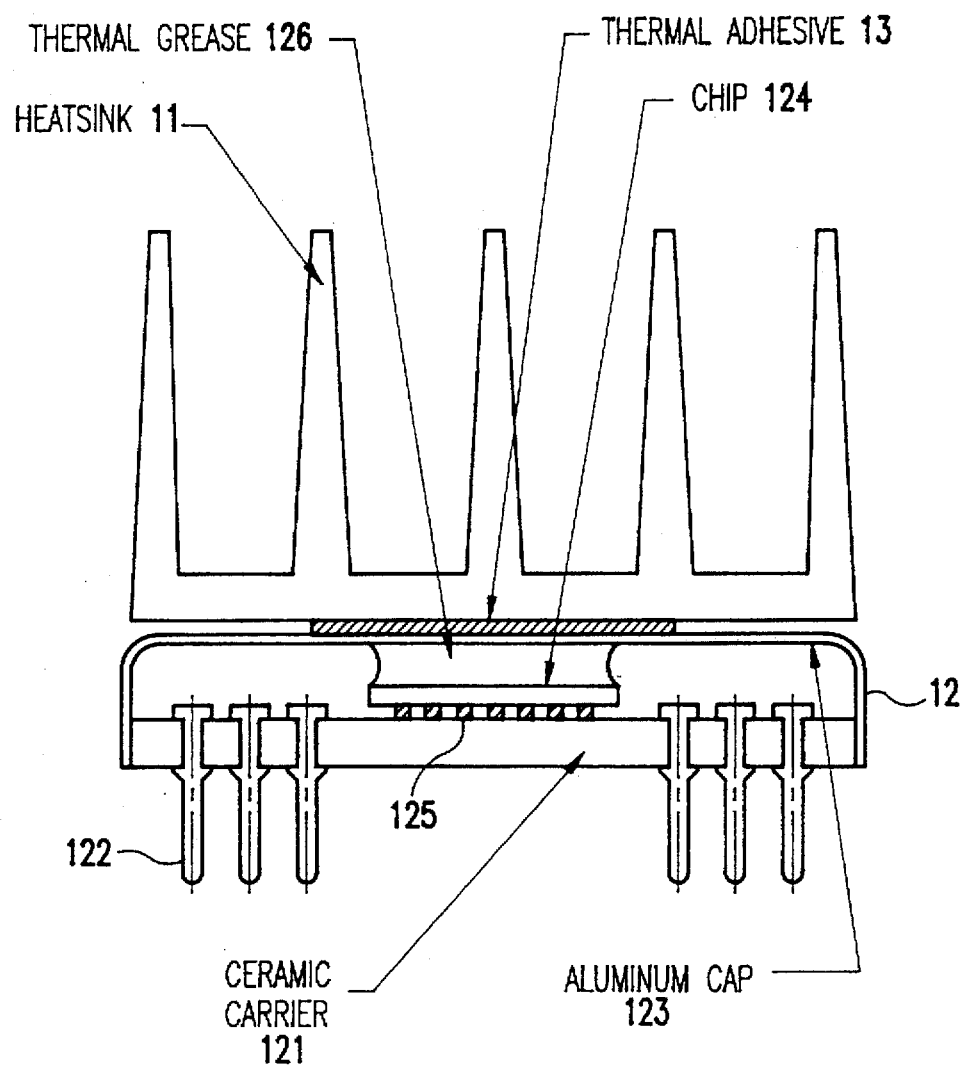
FIG. 1 is a cross-sectional view of a prior art heat sink shown in a ceramic package.
Figure 2:
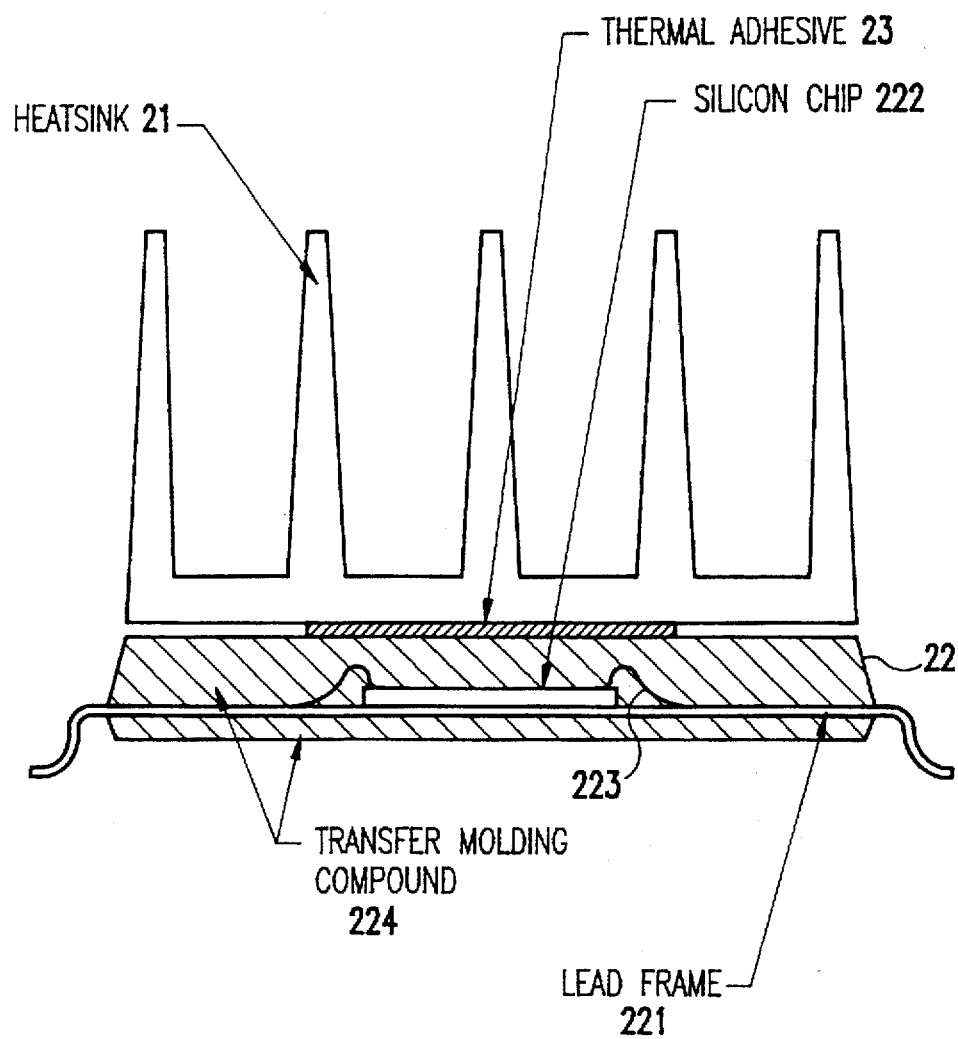
FIG. 2 is a cross-sectional view of a prior art heat sink shown in a lead frame package.

Referring now to the drawings, and more particularly to FIGS. 1 and 2, there are shown typical cross-sections of present state of the art heaksinks comprised of multiple material layers with varying thermal conductivities, K. FIG. 1 is an example of a heatsink 11 with a ceramic package 12. The heatsink 11 may be, for example, of cast or extruded aluminum. The ceramic package 12 comprises a ceramic carrier 121 having pins 122 and enclosed in an aluminum cap 123. Within the package is a chip 124 of the so-called flip chip variety wherein solder balls 125 are formed on one side of the chip to provide the interconnect to metalized pads on the ceramic carrier 121. A thermal grease 126 fills the gap between the top surface of the chip 124 and the aluminum cap 123. The heat sink 11 is physically attached to the aluminum cap 123 by means of a thermal adhesive 13.

FIG. 2 shows a heat sink 21 in a lead frame package 22. The package 22 comprises a lead frame 221 to which the chip 222 is electrically connected by means of wire leads 223. The lead frame and the chip are embedded in a transfer molding compound 224 to form a dual in-line package (DIP). The heatsink 21 is attached to the package 22 by a thermal adhesive 23.

In FIGS. 1 and 2, the layers shown are the hermetic package, $K_p=0.7$, and a thermal glue, $K_g=1.7$. The total thermal resistance, R, of the package can be expressed as $$R \propto \frac{1}{\Sigma KA},$$

where A is the cross-sectional area of heat flow and K is the thermal resistance. In this case, the thermal resistance is $$R_{tot} = 2.02 \frac{°C.}{W \times A},$$

where W is the final chip power in watts. This defines the "intrinsic" heat sink.

Still referring to FIGS. 1 and 2, heat must be transferred from the intrinsic heat sink to the environment surrounding this package. The present state of the art utilizes either convection or cooling through an ambient or refrigerated means as shown in the figures. This part of the system is defined as the "extrinsic" heat sink. In this case, a bonded aluminum heat sink is used where $K_{Al}$=205. Thus, the total thermal resistance is still $$R_{tot} = 2.02 \frac{°C.}{W \times A}.$$

In this case, the extrinsic heat sink does not limit the heat transfer since the intrinsic resistance is significantly worse than the extrinsic resistance.

To enhance the intrinsic heat sink efficiency, one would like to increase the thermal conductivities of the multiple layers, and increase the cross-sectional area, if possible. Assuming the intrinsic efficiency is improved, then one must also improve upon the extrinsic heat sink so that it does not become the weak link in this heat removal circuit.

Method to Improve the Cross-Sectional Area for Improved Heat Intrinsic Transmission According to the invention, the first step in the process is to begin with a fully fabricated silicon wafer of any product as the starting material. A front side protect, backside open step is performed on the wafer. This is a standard process which may or may not be typically practiced. In the preferred embodiment, a polyimide is spun on to a thickness of 1 to 2 μm and then annealed in an inert gas ambient at 300° to 350° C. If a final passivation layer is high temperature polyimide, a thin (20 to 30 nm) low temperature plasma enhanced chemical vapor deposition (PECVD) nitride layer can be deposited on top to act as a final oxygen etch barrier when the polyimide is removed. With the backside open, it is subjected to a wet etch in buffered hydrofluoric acid (7:1) for approximately twenty seconds to remove native oxide.

Figure 3:
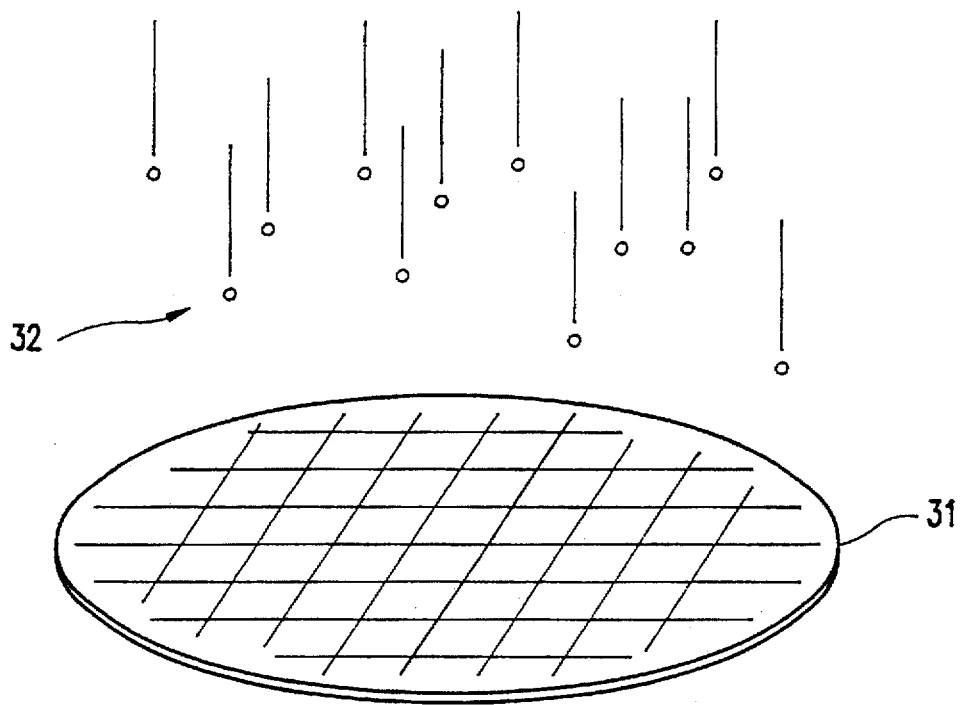
FIG. 3 is a pictorial illustration of the backside roughening process by particle bombardment according to the invention.

Referring now to FIG. 3, the backside of the wafer 31 is now roughened. Roughening may be accomplished in many ways. In a first embodiment, the backside surface is etched with high pressure inert particles 32. A second embodiment employs trench etching techniques, a standard dynamic random access memory (DRAM) fabrication practice. A third embodiment employs the deposition of a porous material through which an irregular thermally conductive crystalline-like material (e.g., epitaxial silicon, diamond, nickel, etc.) can be grown, which structure will complete the fabrication of a roughened silicon back layer. This technique is advantageous where silicon wafers have been thinned or cannot withstand the treatments of first two embodiments. A fourth embodiment utilizes a random screening process to deposit an irregular mask which can be used in one of two ways. The first way is to utilize this mask as the actual roughened surface, thus acting as a superstructure as in the third embodiment. Alternatively, this mask is used to enhance the roughening of embodiments one or two.

Figure 4A:
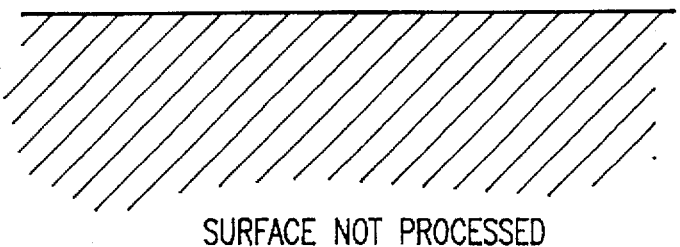
FIGS. 4A, 4B and 4C are respectively enlarged cross-sectional views of the surface before processing, the surface after bombarding with particles, and the surface with etched trenches.
Figure 4B:
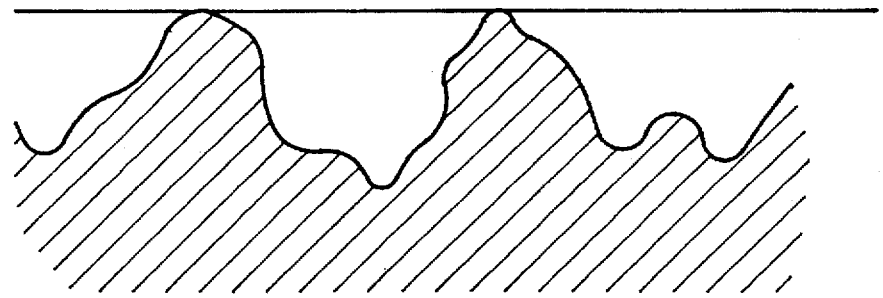
Figure 4C:
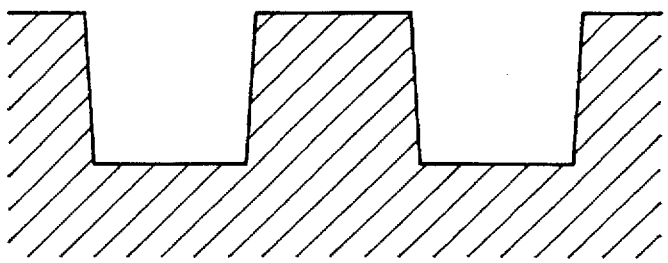

FIGS. 4A, 4B and 4C, respectively show an unprocessed surface, a surface which is roughened by particle bombardment, and surface roughened by etching. In FIG. 4B, the backside is roughened by inert particles (particle size of about 30 nm) to create rough surface. Optionally, the backside surface can be patterned by depositing a PECVD plasma oxide (200° C.), patterning the surface, etching trenches (1×1 to 3 μm size), and removing the oxide mask to produce the surface shown in FIG. 4C.

A low temperature gettering is optionally performed by ozone plasma exposure of the backside (5 to 10 Torr, AME5000 system, 300 W RF, 250° to 3000° C., for 5 to 10 min.) to diffuse oxygen and oxidize the backside surface. An additional benefit may also be realized by combining the metal sintering with a low temperature anneal which would getter impurities to this backside metal, thus improving silicon properties such as junction leakage, DRAM retention time, metal oxide semiconductor field effect transistor (MOSFET) subthreshold slope, and hot carrier hardness of the MOSFET. The low temperature anneal can be achieved by exposing the freshly roughened (or patterned etched) backside surface to ozone or oxygen plasma at temperatures of 200° to 300° C. The reactive ion species (O, $O_2^+$, $O^{++}$) in the plasma will diffuse into the silicon substrate to form a low concentration of oxygen doped layer in the silicon. This low doped layer is an excellent gettering barrier for mobile metal such as nickel (Ni), chromium (Cr) and iron (Fe).

Figure 5:
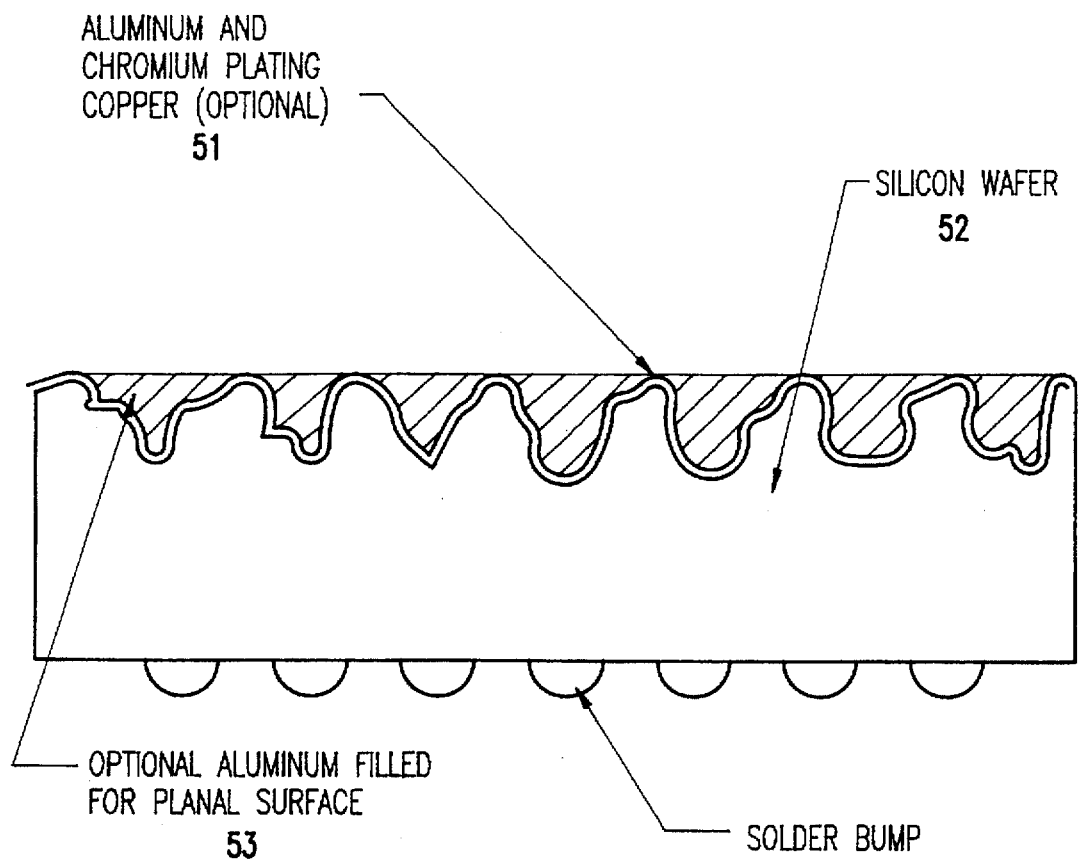
FIG. 5 is a cross-sectional view of a silicon chip after aluminum deposition and anneal.

As shown in FIG. 5, a metal interlayer coating 51 is applied to the backside of the wafer 52 by sequentially evaporating aluminum (Al) and depositing to a thickness of 5 to 10 μm and then chromium (Cr) to a thickness of 0.2 μm using 200 mm ULVAC tool (1.3 kW, 145° C.) and sintering (250° to 300° C. in FG), if needed. Copper (Cu) is then sputtered over the Al, Cr interlayer in ULVAC (1.5 kW, 150° C., variable thickness depending on front side chip structure). Optionally, aluminum 53 may be plated to fill the voids in backside surface and then a chemical-mechanical polish (CMP) used to planarize the surface.

A thermally conductive heat reflowable material, such as solder or gold eutectic, is then deposited and reflowed on the coated backside of the wafer providing the interconnect material to the extrinsic heat sink. In this system, the surface area for transfer is increased by a factor of two, and the thermal conductivities of the extrinsic layers are aluminum plating, $K_{Al}$=205, and lead/tin, $K_{Pb/Sn}$=63. We find $$R_{int} = 0.01 \frac{°C.}{W \times A}.$$

This is an improvement approaching 202 times the presently practiced systems.

Finally, the front side polyimide is removed by chemical downstream etching (CDE) plasma or gasonic downstream oxygen etch prior to dicing the wafer into chips.

Method to Improve the Extrinsic Heat Sink Properties

Figure 6:
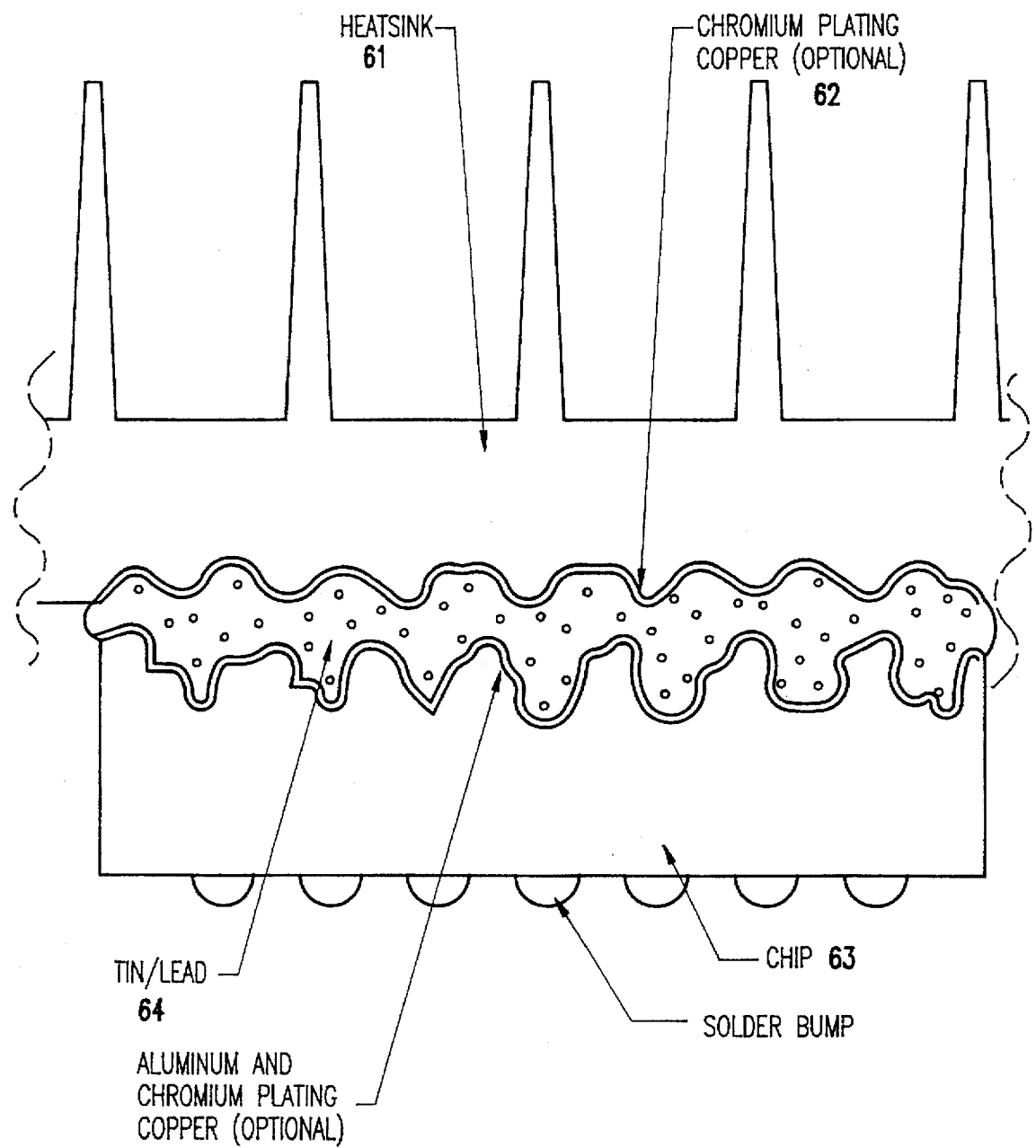
FIG. 6 is a cross-sectional view of the silicon chip of FIG. 5 after extrinsic roughening and connection to intrinsic heatsink.

Following in the same practice as the intrinsic heat sink, FIG. 6 shows a roughened heat sink 61, which again improves the surface area for heat transmission. The heat sink 61 (of cast or extruded aluminum, for example) may be roughened as was the wafer and then an optional plating of chromium and copper 62 applied. The chip 63 is attached to the heatsink 61 by means of heat reflowing the thermally conductive reflowable material 64. This system then results in $$R_{tot} = 0.013 \frac{°C.}{W \times A}.$$

This is an improvement approaching 160 times the presently practiced systems.

Figure 7:
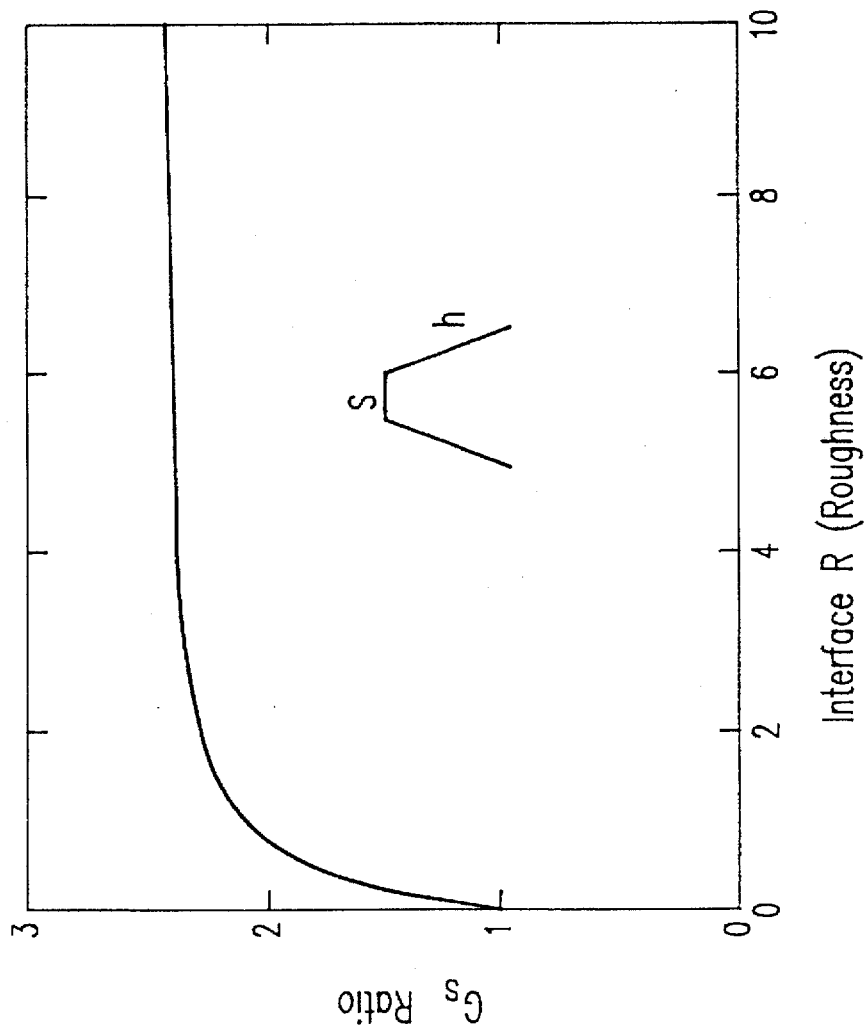
FIG. 7 is a graph showing the improved delamination properties of an integrated package manufactured according to the invention.

As shown by the graph of FIG. 7, an integrated package made with a roughened wafer surface according to the teachings of this invention will resist delamination typically two and one half times more than a package which is not made by roughening the wafer surface. This coupled with the substantial improvements realized in both intrinsic and extrinsic properties of the heatsink makes this packaging technique for today's high density ULSI chip packages.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An integrated package of an integrated circuit and a heatsink comprising:

an integrated circuit chip having a front side and a backside, the front side including an interconnect structure and the backside being covered with a metal interlayer, wherein the backside includes an irregular rough surface, the metal conforming to the irregular rough surface and forming a plated backside of said integrated circuit chip; and a heatsink directly joined to the plated backside of the integrated circuit chip with a thermally conductive reflowable material.

2. The integrated package recited in claim 1, wherein a mating surface of the heatsink includes a second irregular rough surface.

3. The integrated package recited in claim 2, wherein the second irregular rough surface of the heatsink is plated with a metal interlayer.

4. The integrated package recited in claim 3, wherein the metal interlayer coated on the backside of the integrated circuit chip comprises a first coating of aluminum and a second coating of chromium over said first coating.

5. The integrated package recited in claim 4, wherein the metal interlayer coated on the backside of the integrated circuit chip further includes a third coating of copper over the chromium.

6. The integrated package recited in claim 4, wherein the metal interlayer coated on the mating surface of the heatsink comprises chromium.

* * * * *